United States Patent
Hou

(10) Patent No.: US 12,413,216 B2
(45) Date of Patent: Sep. 9, 2025

(54) DELAY MEASUREMENT CIRCUIT AND ITS CONTROL METHOD

(71) Applicant: ChangXin Memory Technologies, Inc., Hefei (CN)

(72) Inventor: Chuangming Hou, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 18/547,480

(22) PCT Filed: Jul. 7, 2022

(86) PCT No.: PCT/CN2022/104374
§ 371 (c)(1),
(2) Date: Aug. 22, 2023

(87) PCT Pub. No.: WO2023/231143
PCT Pub. Date: Dec. 7, 2023

(65) Prior Publication Data
US 2025/0015789 A1    Jan. 9, 2025

(30) Foreign Application Priority Data

Jun. 1, 2022   (CN) .......................... 202210616424.5

(51) Int. Cl.
*H03K 5/14* (2014.01)
*H03K 5/19* (2006.01)
*H03K 19/20* (2006.01)

(52) U.S. Cl.
CPC .................. *H03K 5/14* (2013.01); *H03K 5/19* (2013.01); *H03K 19/20* (2013.01)

(58) Field of Classification Search
CPC ............ H03K 5/14; H03K 5/19; H03K 19/20; H03K 3/03; H03K 3/0315; H03K 5/133;
(Continued)

(56) References Cited

U.S. PATENT DOCUMENTS

| | | | | |
|---|---|---|---|---|
| 4,560,954 A | * | 12/1985 | Leach | H03K 3/014 327/295 |
| 11,342,927 B1 | * | 5/2022 | Lim | H03L 7/0995 |
| 2023/0253958 A1 | * | 8/2023 | Chen | H03K 3/0315 331/57 |

FOREIGN PATENT DOCUMENTS

CN        113691220 A        11/2021

OTHER PUBLICATIONS

PCT/CN2022/104374 International Search Report mailed Dec. 20, 2022.

* cited by examiner

*Primary Examiner* — John W Poos
(74) *Attorney, Agent, or Firm* — SYNCODA LLC; Feng Ma

(57) ABSTRACT

A delay measuring circuit includes a control oscillation module with its input terminal connected to its output terminal, which sequentially generates a number of time delay signals with a cycle time T after receiving first enable control signal; a target oscillating module receives a second enabling signal delayed by a first preset threshold than the first enabling signal; after the first preset time T1 is disconnected from the ground terminal/power supply terminal, each stage of the target unit in the target oscillating module connects at the second preset time T2. The level of the target unit turns over at first preset time T1, and target unit maintains logic level for second preset time T2; T1+T2=T/2, and N is an odd integer. So leakage current is reduced and mutual influence of the action current between the adjacent two-level target units are avoided, thus improving ring oscillator performance and reliability.

18 Claims, 13 Drawing Sheets

(58) Field of Classification Search
CPC ......... H03K 5/131; H03K 2005/00078; H03K 19/017509; H03K 21/02; H03K 3/011; H03K 3/0322; H03K 5/135; H03K 5/24; H03K 19/195; H03K 3/38; H03K 2005/00071; H03K 17/6872; H03K 3/012; H03K 2005/00019; H03K 2005/00039; H03K 2005/00058; H03K 2005/00065; H03K 2005/00195; H03K 2005/00202; H03K 3/013; H03K 3/02; H03K 5/134; H03K 19/00346; H03K 3/037; H03K 3/354; H03K 5/00006; H03K 5/04; H03K 5/05; H03K 5/1565; H03K 7/00; H03K 2005/00091; H03K 3/356182; H03K 5/06; H03K 5/1502; H03K 5/151; H03K 17/102; H03K 2005/00084; H03K 2005/00097; H03K 5/13; H03K 5/15046; H03K 5/159; H03B 5/06; H03B 23/00; H03B 5/1841; H03B 5/30; H03B 5/36; H03B 5/00; H03B 5/04; H03B 5/12; H03B 5/26; H03B 19/00; H03B 2200/0094; H03B 27/00; H03B 5/364

See application file for complete search history.

DELAY MEASUREMENT CIRCUIT AND ITS CONTROL METHOD

CROSS REFERENCES TO RELATED APPLICATIONS

This application claims the benefit of priority to Chinese patent application with the application number 202210616424.5, and application name "Delay Measurement Circuit and Its Control Method", filed with the China National Intellectual Property Administration on Jun. 1, 2022, the contents of which are incorporated herein by reference in its entirety.

TECHNICAL FIELD

The present disclosure relates to the field of integrated circuits, related to but not limited to a delay measurement circuit and its control method.

BACKGROUND

A ring oscillator is generally a ring structure formed by connecting the output terminals and input terminals of three or more odd-numbered inverters end to end. Ring oscillators have the advantages of simple circuits, easy start-up, and easy integration, and are widely used in high-frequency oscillators inside integrated circuits and simple oscillators in ordinary digital circuits.

However, for a ring oscillator using a complementary metal oxide semiconductor (CMOS) NOT gate, the operating currents between two adjacent stages will affect each other, resulting in difficult to determine the performance parameters of each stage of the inverter, which reduces the performance and reliability of each stage of the inverter operation.

SUMMARY

According to various embodiments of the present disclosure, a delay measurement circuit and a control method are provided.

According to the disclosure, the first embodiment provides a delay measurement circuit, including a control oscillation module and a target oscillating module, and the control oscillation module is configured to: an input terminal is connected to an output terminal thereof for receiving a first enable signal, and sequentially generate several control signals with cycle time T according to the first enable signal; the target oscillating module is configured as: the input terminal is connected to its output terminal for receiving the second enable signal, and the second enable signal is delayed by a first preset threshold $\Delta T$ than the first enable signal; wherein, the target oscillating module includes N stages of target units connected in series, and each stage of the target units is used to connect to the ground terminal/power supply terminal within the second preset time T2 after the control signal is disconnected from the ground terminal/power supply terminal within the first preset time T1, wherein the first preset time T1 is the flipping time for the target unit level for, the second preset time T2 is the time for the target unit to maintain the logic level, so as to reduce the leakage current of the target unit in the first preset time T1; $T1+T2=T/2$; N is an odd number.

According to some embodiments, the output terminal of the target oscillating module outputs a target output signal; the target oscillating module includes a first logic control unit and a target link unit, and the first logic control unit is configured to: the first input terminal is used to receive the target output signal, the second input terminal is used to receive the second enabling signal, and the output terminal is used to output the first initial delay signal; the target link unit is configured to: the first input terminal receives the first initial delay signal, the second input terminal receives a control signal and is used for generating the target output signal according to the control signal and the first initial delay signal.

According to some embodiments, the first logic control unit includes a first NAND gate, configured to receive the target output signal and output a first initial delay signal when the second enable signal is valid, and the first initial delay signal is the opposite of the level state of the target output signal.

According to some embodiments, the target link unit includes N stages of target units connected in series; N>2; the input terminal of the first stage target unit is connected to the output terminal of the first logic control unit to receive the first initial delay signal; the last stage output terminal of the target unit is used as the output terminal of the target link unit; each level of target unit is also configured as follows: the control terminal is used to receive the corresponding control signal, the first terminal is connected to the first potential, and the second terminal is connected to the target potential.

According to some embodiments, the target unit includes a sub-target unit and a controllable switch unit, and the sub-target unit is configured as follows: the input terminal is connected to the output terminal of the target unit of the adjacent previous stage, and the first terminal is connected to the first potential, the second end is connected to the target potential via the controllable switch unit; when the control signal is within the first level range, the controllable switch unit is disconnected within the first preset time T1; when the control signal is within the second level range, the controllable switch unit is turned on within the second preset time T2.

According to some embodiments, the target potential includes a ground terminal; the controllable switch unit includes a first switch unit; the first switch unit is configured as follows: the first terminal is connected to the sub-target unit, the control terminal receives a corresponding control signal, and the second terminal is connected to the ground terminal; the potential difference between the first potential and the ground terminal is greater than zero.

According to some embodiments, the target potential includes a power supply terminal; the controllable switch unit includes a second switch unit; the second switch unit is configured as follows: the first terminal is connected to the power supply terminal, the control terminal receives a corresponding control signal, and the second terminal is connected to the terminal of the target unit; the potential difference between the power supply terminal and the first potential is greater than zero.

According to some embodiments, the sub-target unit includes a first transistor and a second transistor, and the first transistor is configured as follows: the first terminal is connected to the first potential, the control terminal is connected to the output terminal of the adjacent previous stage target unit, and the second terminal serves as the output terminal of the current target unit; the second transistor is configured as follows: the first terminal is connected to the second terminal of the first transistor, the second terminal is connected to the ground terminal through the first switch unit, and the control terminal is connected to the control terminal of the first transistor.

According to some embodiments, the first switch unit includes a third transistor, and the third transistor is configured such that: the first terminal is connected to the second terminal of the second transistor, the control terminal receives a corresponding control signal, and the second terminal is connected to the ground terminal; wherein, the third transistor is used to turn on within the second preset time T2 after being turned off within the first preset time T1 in response to the control signal.

According to some embodiments, the sub-target unit includes a first transistor and a second transistor, and the first transistor is configured as follows: the first terminal is connected to the second terminal of the second switch unit, and the control terminal is connected to the output terminal of the adjacent previous stage target unit, the second terminal is used as the output terminal of the current target unit; the second transistor is configured as follows: the first terminal is connected to the second terminal of the first transistor, the second terminal is connected to the ground terminal, and the control terminal is connected to the control terminal of the first transistor.

According to some embodiments, the second switch unit includes a fourth transistor, and the fourth transistor is configured as follows: a first terminal is connected to a power supply terminal, a control terminal receives a corresponding control signal, and a second terminal is connected to the first terminal of the first transistor; wherein, the fourth transistor is used to turn on within the second preset time T2 after being turned off within the first preset time T1 in response to the control signal.

According to some embodiments, the delay measurement circuit further includes a delay module coupled to the target oscillating module, the delay module is configured as follows: the input terminal is used to receive the first enable signal, the output terminal is connected to the input terminal of the target oscillating module, it is used for generating a second enabling signal according to the first enabling signal and providing it to the target oscillating module.

According to some embodiments, the output terminal of the control oscillation module outputs an initial output signal, the control oscillation module includes a second logic control unit and a control link unit, and the second logic control unit is configured to: the first input terminal is used to receive the initial output signal, the second input terminal is used to receive the first enabling signal, and the output terminal is used to output the first control signal; the control link unit includes N-level series control units, which are used to sequentially generate N−1 control signal and initial output signal; wherein, the first-level control unit is connected to the output terminal of the second logic control unit, the output terminal of the last-level control unit is used as the output terminal of the control oscillation module, and the input terminal of each control unit Connect the control terminal of the corresponding target unit.

According to some embodiments, the second logic control unit includes a second NAND gate, and the second NAND gate is configured to: receive the initial output signal and output the first control signal when the first enable signal is valid, the second control signal is the inverse of the level state of the original output signal.

According to some embodiments, the control unit includes a first inverter; N stages of series-connected first inverters are used to sequentially generate N−1 control signals and initial output signals according to the received first control signal, wherein each An input terminal of an inverter is connected to a corresponding control end of the target unit.

According to some embodiments, $T1+MT \leq \Delta T < (M+0.5)T$, where M is a positive integer.

According to some embodiments, the delay measurement circuit further includes an address circuit, and the address circuit is used to receive an address signal, and generate a plurality of the first enabling signals according to the address signal to provide to the control oscillation module to trigger a corresponding to the action of the control oscillation module and the target oscillating module.

According to some embodiments, the second aspect of the present disclosure provides a method of controlling a delay measurement circuit, including:

The control-based oscillation module responds to the first enable signal and sequentially generates several control signals which has the cycle time T;

Generating a second enabling signal according to the first enabling signal, the second enabling signal is delayed by a first preset threshold $\Delta T$ than the first enabling signal;

Control the target unit of each level in the target oscillating module after disconnecting from the target potential within the first preset time T1 according to the received control signal, and then connect to the target potential within the second preset time T2, and the target unit is in the second preset time T2. The logic level is maintained within the preset time T2, and the first preset time T1 is the time when the level of the target unit is reversed, so as to reduce the leakage current of the target unit within the first preset time T1; $T1+T2=T/2$; N is an odd number.

Embodiments of the present disclosure may/at least have the following advantages:

In the delay measurement circuit and its control method provided by the embodiments of the present disclosure, the control oscillation module is set to sequentially generate several control signals with cycle time T according to the first enable signal, and the target oscillating module is set to respond to the second enable signal triggering the action of the target units at all levels, so that each level of the target unit in the target oscillating module is disconnected from the target potential within the first preset time T1 according to the received control signal, and then connected to the target potential within the second preset time T2. The target potential is connected, and the target unit maintains a logic level within the second preset time T2, so as to reduce the leakage current during the level inversion of the target unit in response to the input signal within the first preset time T1, and avoid two operating currents between adjacent stages of the target units will affect each other; thereby improving the accuracy of the electrical parameters of the target units at all levels in the delay measurement circuit, and improving the performance and reliability of the ring oscillator.

In summary, the delay measurement circuit and its control method provided by the embodiments of the present disclosure can at least avoid the interaction of operating currents between two adjacent target units, thereby improving the accuracy of the electrical parameters of the target units at each level in the delay measurement circuit, performance, improving the performance and reliability of the ring oscillator.

The details of one or more embodiments of the disclosure are set forth in the accompanying drawings and the description below. Other features, objects, and advantages of the present disclosure will be apparent from the description, drawings, and claims.

BRIEF DESCRIPTION OF THE DRAWINGS

In order to more clearly illustrate the technical solutions in the embodiments of the present disclosure, the drawings that need to be used in the description of the embodiments will be briefly introduced below. Obviously, the drawings in the following description are only some embodiments of the present disclosure. For those skilled in the art, other drawings can also be obtained based on these drawings without creative effort.

DETAILED DESCRIPTION OF THE PREFERRED EMBODIMENTS

Figure 1:
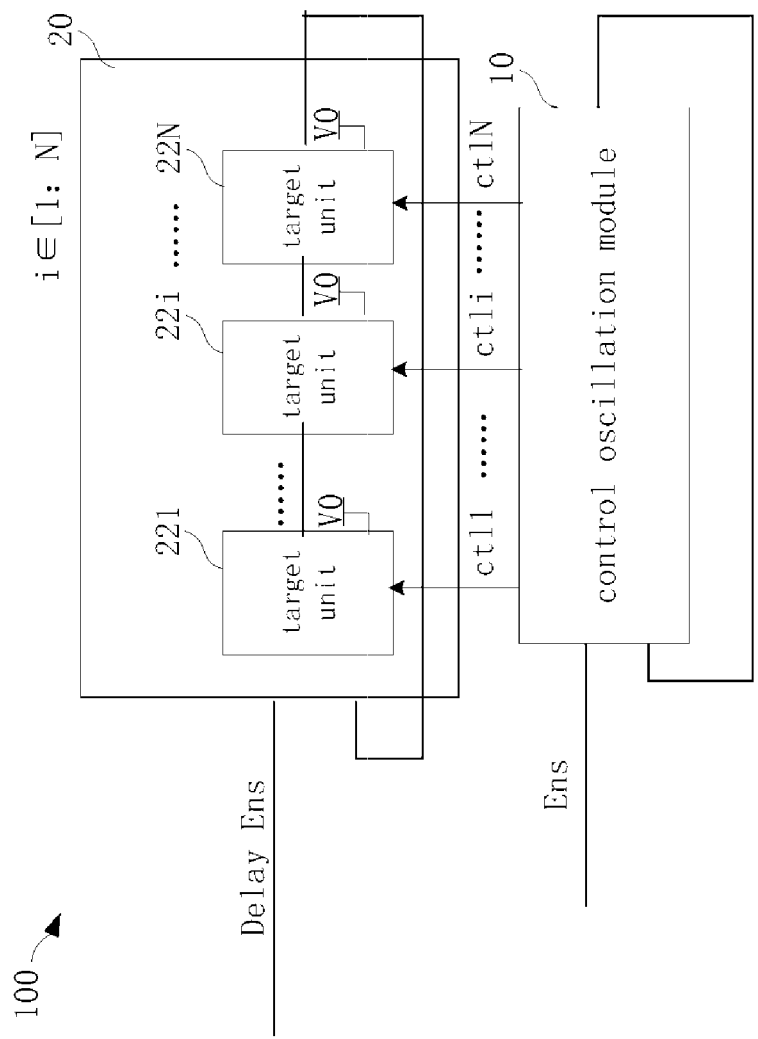
FIG. 1 is a schematic block diagram of a delay measurement circuit according to the first embodiment of the present disclosure.

In order to facilitate understanding of the present disclosure, the present disclosure will be described more fully below with reference to the related drawings. The preferred embodiments of the present disclosure are shown in the drawings. However, the present disclosure can be embodied in many different forms and is not limited to the embodiments described herein. Rather, these embodiments are provided so that the disclosure of the present disclosure will be thorough and complete.

Unless otherwise defined, all technical and scientific terms used herein have the same meaning as commonly understood by one of ordinary skill in the art to which this disclosure belongs. The terms used herein in the description of the present disclosure are for the purpose of describing specific embodiments only, and are not intended to limit the present disclosure.

Additionally, certain terms are used throughout the specification and claims that follow to refer to specific elements. Those skilled in the art will appreciate that manufacturers may refer to elements by different names. This document does not intend to distinguish between components with different names but with the same function. In the following descriptions and examples, the terms "comprising" and "including" are used openly, and thus should be read as "including, but not limited to . . . ". Likewise, the term "connected" is intended to mean an indirect or direct electrical connection. Accordingly, if one device is connected to another device, the connection may be through a direct electrical connection, or through an indirect electrical connection through other devices and connections.

It should be understood that although the terms "first", "first", etc. may be used herein to describe various elements, these elements should not be limited by these terms. These terms are only used to distinguish one element from another. For example, a first element could be termed a first element, and, similarly, a first element could be termed a first element, without departing from the scope of the present disclosure.

Please note that the magnitude of the first potential VDD1 described in the embodiments of the present disclosure is VDD1, the magnitude of the second potential VDD2 is VDD2, and the magnitude of the third potential VDD3 is VDD3; which is the potential point of the input voltage.

Please refer to FIG. 1. In one embodiment of the present disclosure, a delay measurement circuit 100 is provided, including a control oscillation module 10 and a target oscillating module 20. The control oscillation module 10 is configured as: the first input terminal is connected to the control oscillation The output terminal of the module 10 and the second input terminal receive the first enable signal Ens, and are used to sequentially generate several control signals ctli with a cycle duration of T according to the first enable signal Ens; the target oscillating module 20 is configured as: the first The input terminal is connected to the output terminal of the target oscillating module 20, the second input terminal receives the second enable signal Delay_Ens, and the second enable signal Delay_Ens is delayed by the first preset threshold ΔT compared with the first enable signal Ens; wherein, the target oscillating module 20 includes N stages of target units connected in series, such as target units 221, . . . , target units 22i, . . . , and target units 22N, and each level of target units 22i communicates with the target within the first preset time T1 according to the received control signal ctli After the potential V0 is disconnected, it is connected to the target potential V0 within the second preset time T2, and the target unit 22i maintains a logic level within the second preset time T2, so as to reduce the response of the target unit 22i to the input signal during the first During the level inversion period within the preset time T1, through the leakage current generated by the adjacent previous target unit, and before the target unit 22i returns to the state, the corresponding control signal has controlled the adjacent previous target unit in the second preset Assuming that it is connected to the target potential V0 within the time T2, it will not affect the dynamic current change of the target unit 22i during the recovery state; i∈[1, N], i and N are both integers greater than or equal to 1, N is an odd number, T1+T2=T/2; to avoid mutual influence of operating currents between two adjacent target units, thereby improving the accuracy of electrical parameters of each target unit in the delay measurement circuit 100 and improving the performance and reliability of the ring oscillator.

As an example, please continue to refer to FIG. 1, the input current i_1 driving the power supply port in the target unit 22i can be measured during the static period of the delay measurement circuit, and the input of the drive power supply port in the target unit 22i can be measured during the oscillation period of the delay measurement circuit Current i_2; the difference i_c between current i_2 and current i_1 is the effective drive current of the delay measurement circuit, set the drive voltage of the drive power supply port as V_d, and according to the effective drive current i_c and drive voltage V_d of the delay measurement circuit, the equivalent resistance of the delay measurement circuit can be obtained, and then the equivalent capacitance of the delay measurement circuit can be obtained according to the quotient of the delay time of the delay measurement circuit and the equivalent resistance. Since each stage of the target unit 22i in the target oscillating module 20 is disconnected from the target potential V0 within the first preset time T1 according to the received control signal ctli, and then connected to the target potential V0 within the second preset time T2, and The target unit 22i maintains a logic level within the second preset time T2, so as to reduce the leakage generated by the adjacent previous target unit during the level inversion of the target unit 22i in response to the input signal within the first preset time T1, current, and before the target unit 22i returns to the recovery state, the corresponding control signal has controlled the adjacent previous target unit to communicate with the target potential V0 within the second preset time T2, which will not affect the dynamic current of the target unit 22i during the recovery state Change; i∈[1, N], i, N are integers greater than or equal to 1, N is an odd number, T1+T2=T/2; avoid the mutual influence of action currents between adjacent two-level target units, thus the accuracy of the electrical parameters of the target units at all levels in the delay measurement circuit 100 is improved, and the performance and reliability of the ring oscillator are improved.

As an example, please refer to FIG. 2a-FIG. 2b, the target potential V0 may include the ground terminal GND or the power supply terminal VDD2, and the output terminal of the target oscillating module 20 outputs the target output signal outd; the target oscillating module 20 includes a first logic control unit 21 and a target The link unit 22, the first logic control unit 21 is configured as follows: the first input terminal is connected to the output terminal of the target oscillating module 20 to receive the target output signal outd, and the second input terminal receives the second enabling signal Delay_Ens for according to the second enable signal Delay_Ens and the target output signal outd generate the first initial delay signal s1; the target link unit 22 is configured to: the first input terminal is connected to the output terminal of the first logic control unit 21 to receive the first initial delay signal s1, the second input terminal receives the control signal, which is used to generate the target output signal outd according to the control signal and the first initial delay signal; the target unit 22i in the target link unit 22 is within the first preset time T1 according to the received control signal ctli After being disconnected from the ground terminal GND/power supply terminal VDD2, it is connected to the ground terminal GND/power supply terminal VDD2 within the second preset time T2, and the target unit 22i maintains a logic level within the second preset time T2 to reduce During the level inversion of the small target unit 22i in response to the input signal within the first preset time T1, the leakage current generated by the adjacent previous target unit, and before the target unit 22i returns to the state, the corresponding control signal has controlled the phase of the target unit adjacent to the previous level is connected to the ground terminal GND/power supply terminal VDD2 within the second preset time T2, which will not affect the dynamic current change of the target unit 22i during the recovery state; i∈[1, N], i, N are all is an integer greater than or equal to 1, N is an odd number, T1+T2=T/2; avoiding the interaction of the action currents between the adjacent two-stage target units, thereby improving the electrical parameters of the target units at all levels in the delay measurement circuit 100 accuracy, improving the performance and reliability of ring oscillators.

Figure 2A:
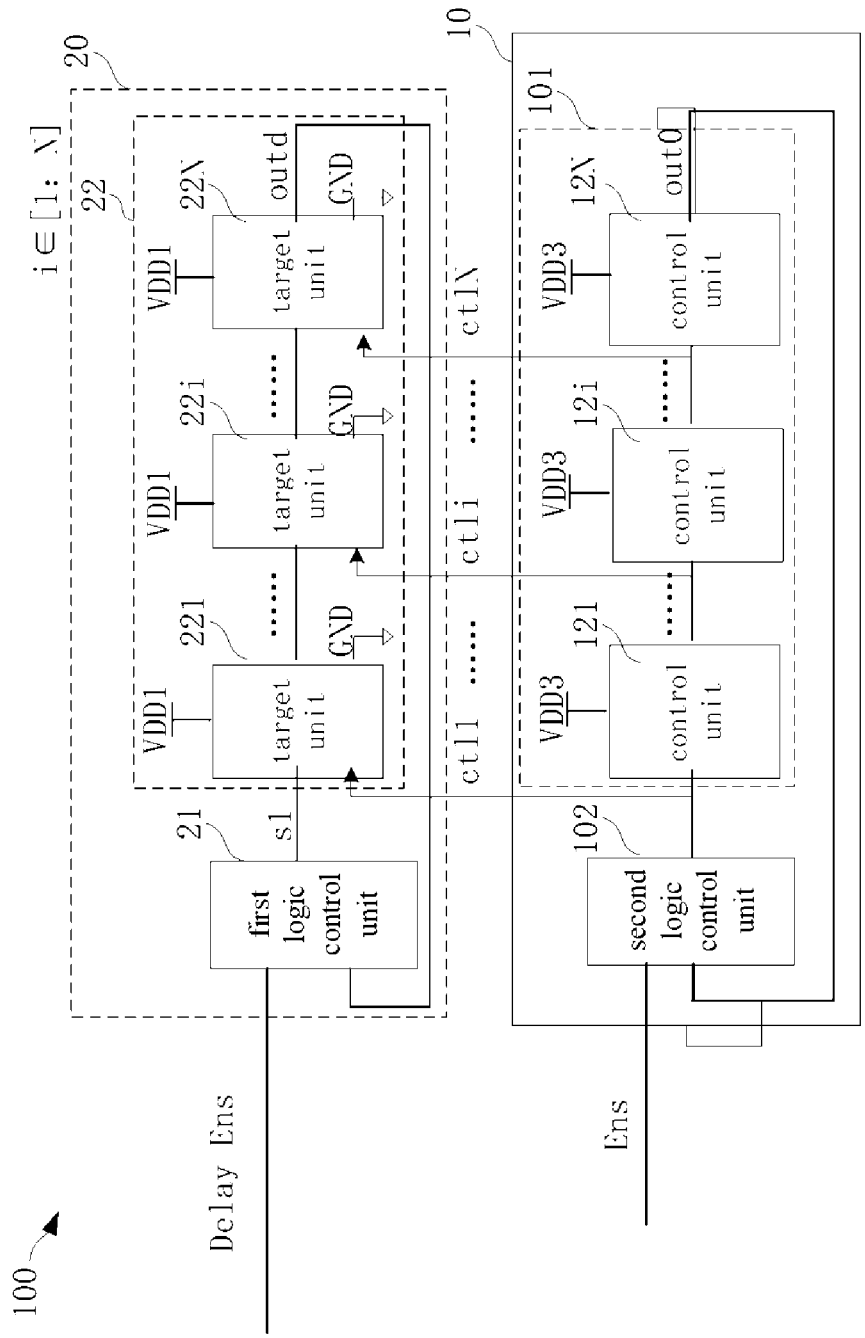
FIG. 2a is a schematic block diagram of a delay measurement circuit according to the second embodiment of the present disclosure.
Figure 2B:
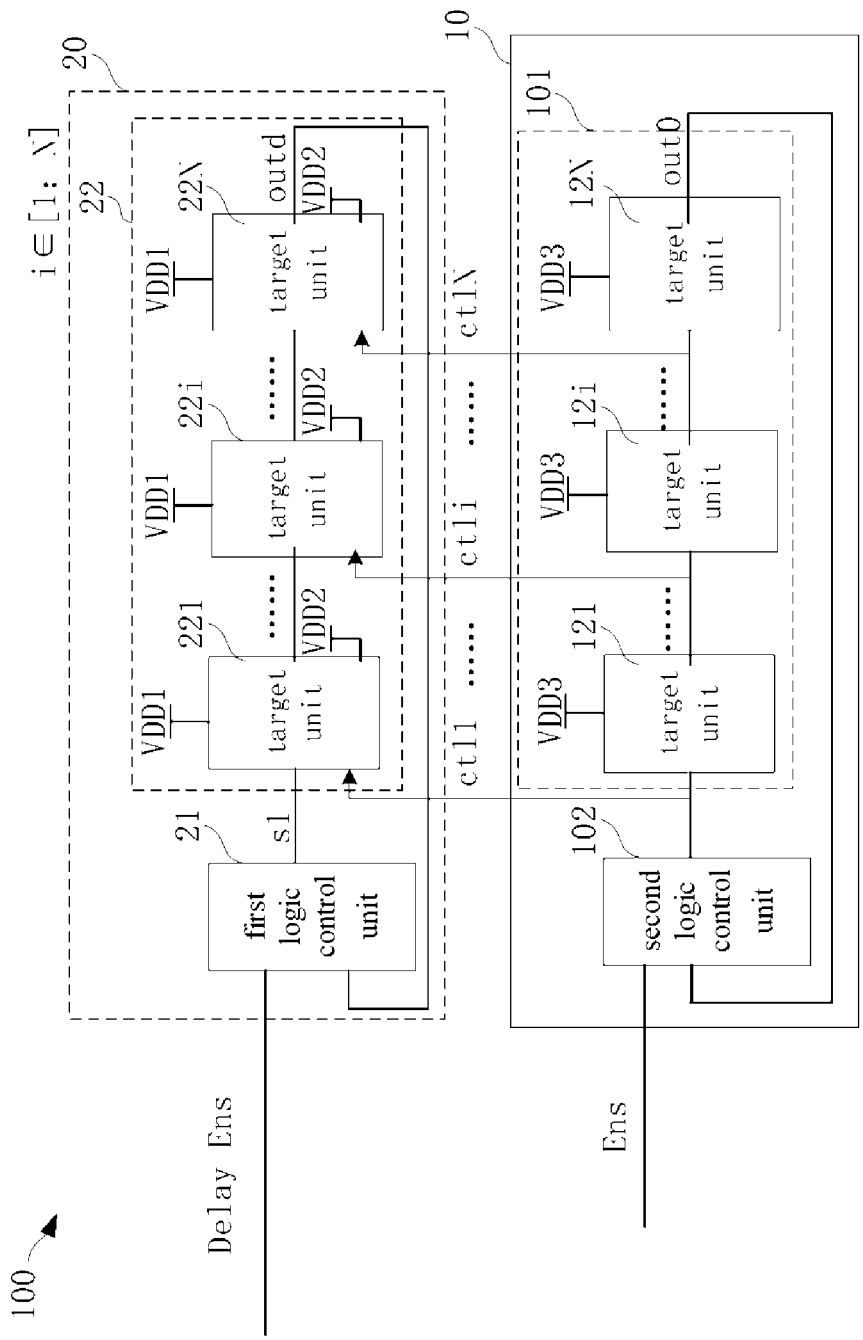
FIG. 2b is a schematic block diagram of a delay measurement circuit according to the third embodiment of the present disclosure.

As an example, please continue to refer to FIG. 2a-FIG. 2b, the target link unit 22 includes N-level series-connected target units 221, . . . , target units 22i, . . . and target units 22N, target units 221, . . . , target units 22i, . . . and the first terminal of the target unit 22N are connected to the first potential VDD1, and the second terminal is connected to the ground terminal GND/power supply terminal VDD2; the input terminal of the first-stage target unit 221 is connected to the first logic control unit 21; the output terminal receives the first initial delay signal s1; the output terminal of the last stage target unit 22N is used as the output terminal of the target link unit 22 to output the target output signal outd; the target unit 22i is configured as: the control terminal is used to receive For the corresponding control signal ctli, the first terminal is connected to the first potential, and the second terminal is connected to the ground terminal GND/power supply terminal VDD2; the target unit 22i is connected to the ground terminal GND/power supply terminal VDD2 within the first preset time T1 according to the received control signal ctli After the power supply terminal VDD2 is disconnected, it is connected to the ground terminal GND/power supply terminal VDD2 within the second preset time T2, and the target unit 22i maintains a logic level within the second preset time T2, so as to reduce the response of the target unit 22i During the level inversion of the input signal within the first preset time T1, the leakage current generated by the adjacent previous stage target unit, and the corresponding control signal has controlled the adjacent previous stage target before the target unit 22i returns to the state of being connected to the ground terminal GND/power supply terminal VDD2 within the second preset time T2, which will not affect the dynamic current change of the target unit 22i during the recovery state; i∈[1, N], i and N are both greater than or equal to 1 is an integer, N is an odd number, T1+T2=T/2; to avoid the interaction of the operating currents between the adjacent two-stage target units, thereby improving the accuracy of the electrical parameters of the target units at all levels in the delay measurement circuit 100, and improving the ring oscillator performance and reliability.

As an example, please continue to refer to FIG. 2a-FIG. 2b, the control oscillation module 10 includes a second logic control unit 102 and a control link unit 101; the second logic control unit 102 is configured as: the first input terminal is connected to the control link unit 101; the output terminal of the output terminal is used to receive the initial output signal out0, and the second input terminal is used to receive the first enable signal Ens for generating the first control signal ctl1 according to the first enable signal Ens and the initial output signal out0; the control link unit 101 Including the control unit 121, . . . , the control unit 12i, . . . and the control unit 12N connected in series, the first ends of the control unit 121, . . . , the control unit 12i, . . . and the control unit 12N are all connected to the third potential VDD3; the potential difference between the first potential VDD1 and the third potential VDD3 can be set to be greater than 0; the first control signal ctl1 is used to trigger the first control unit 121 to generate the second control signal ctl2, . . . , the i-th control signal ctli is used to Trigger the i-th control unit 12i to generate the i+1-th control signal ctli+1, . . . , the N-th control signal ctlN is used to trigger the N-th control unit 12N to generate the initial output signal out0; make the target unit 22i according to the received After the control signal ctli is disconnected from the ground terminal GND/power supply terminal VDD2 within the first preset time T1, it is connected to the ground terminal GND/power supply terminal VDD2 within the second preset time T2, and the target unit 22i is connected to the ground terminal GND/power supply terminal VDD2 within the second preset time T2. It is assumed that the logic level is maintained within the time T2, so as to reduce the leakage current generated by the adjacent previous target unit during the level inversion of the target unit 22i in response to the input signal within the first preset time T1, and the target unit 22i is before the recovery state, the corresponding control signal has controlled the adjacent previous stage target unit to communicate with the ground terminal GND/power supply terminal VDD2 within the second preset time T2, which will not affect the dynamic current change of the target unit 22i during the recovery state; i∈[1, N], i and N are integers greater than or equal to 1, N is an odd number, T1+T2=T/2; avoid mutual influence of action currents between adjacent two-level target units, thereby improving delay accuracy of the electrical parameters of target units at all levels as the circuit 100 is measured to improve the performance and reliability of the ring oscillator.

As an example, please continue to refer to FIG. 2a-FIG. 2b. The number of control units in the control oscillation module 10 can be determined according to the actual needs of specific application scenarios. Those skilled in the art can undoubtedly determine that under the inventive concept of the present disclosure, the equivalent/equivalent modifications all belong to the protection scope of the embodiments of the present disclosure.

As an example, please refer to FIG. 3 a, the target unit 22j includes a sub-target unit 2201 and a first switch unit 2202, the sub-target unit 2201 is configured as follows: the input terminal is connected to the output terminal of the adjacent previous stage target unit, and the first end is connected to the first end of the target unit. A potential VDD1; the first switch unit 2202 is configured as follows: the first terminal is connected to the sub-target unit 2201, the control terminal receives the corresponding control signal, and the second terminal is connected to the ground terminal GND; when the control signal ctlj is within the first level range, for example, when the level is low, the first switch unit 2202 is disconnected from the ground terminal GND within the first preset time T1, and then, when the control signal ctlj is in the second level range, for example, when the level is high, the first switch unit 2202 It is then connected to the ground terminal GND within the second preset time T2, and the sub-target unit 2201 maintains a logic level within the second preset time T2, so as to reduce the response of the target unit 22j to the input signal within the first preset time T1 During the level inversion, through the leakage current generated by the adjacent previous target unit, and before the target unit 22j returns to the state, the corresponding control signal has controlled the adjacent previous target unit to communicate with the target unit within the second preset time T2. The ground terminal GND is connected, and will not affect the dynamic current change of the target unit 22j during the recovery state; j∈[2, N], j, N are integers greater than or equal to 2, N is an odd number, T1+T2=T/2; Avoid mutual influence of the operating currents between adjacent two-level target units, thereby improving the accuracy of the electrical parameters of each level of target units in the delay measurement circuit 100, and improving the performance and reliability of the ring oscillator.

As an example, please refer to FIG. 3 b, the target unit 22j includes a sub-target unit 2201 and a second switch unit 2203, the sub-target unit 2201 is configured as follows: the input terminal is connected to the output terminal of the adjacent previous stage target unit, and the first end is connected to the second switch unit 2203. A potential VDD1; the second switch unit 2203 is configured as follows: the input terminal is connected to the second terminal of the sub-target unit 2201, the control terminal receives the corresponding control signal, and the first terminal is connected to the power supply terminal VDD2; when the control signal ctlj is the first voltage When the control signal ctlj is in the second level range, for example, high level, the second switch unit 2203 is turned off within the first preset time T1, and then, when the control signal ctlj is in the second level range, for example, low level, the second switch unit 2203 is turned off again in the first preset time T1. It is connected to the power supply terminal VDD2 within the second preset time T2, and the sub-target unit 2201 maintains a logic level within the second preset time T2, so as to reduce the level of the target unit 22j responding to the input signal within the first preset time T1 During the inversion period, through the leakage current generated by the target unit of the adjacent previous stage, and before the target unit 22j returns to the state, the corresponding control signal has controlled the target unit of the adjacent previous stage to connect with the power supply terminal VDD2 within the second preset time T2. Connected, will not affect the dynamic current change of the target unit 22j during the recovery state; j∈[2, N], j, N are integers greater than or equal to 2, N is an odd number, T1+T2=T/2; power supply terminal with the potential difference between VDD2 and the first potential VDD1 is greater than zero; avoiding the mutual influence of the operating currents between the two adjacent target units, thereby improving the accuracy of the electrical parameters of the target units at each level in the delay measurement circuit 100, and improving the performance of the ring oscillator and reliability.

Figure 4A:
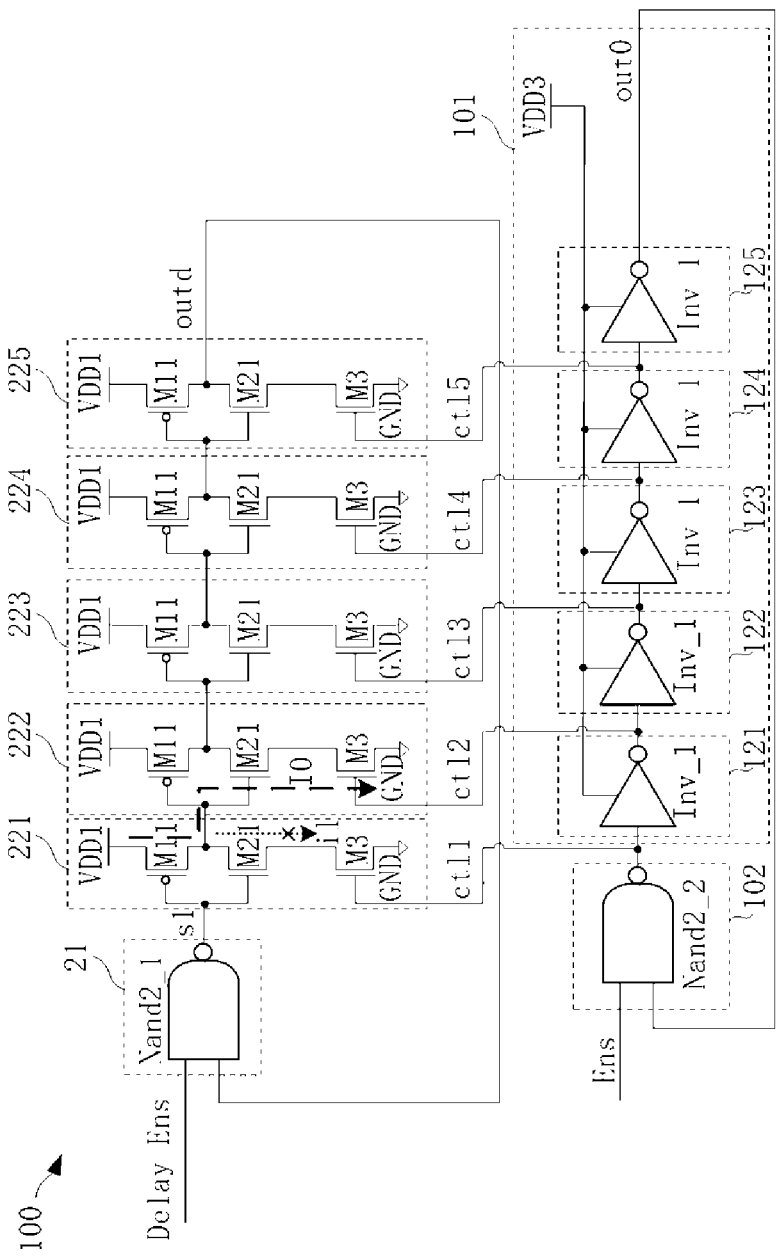
FIG. 4a is a schematic circuit diagram of a delay measurement circuit according to the first embodiment of the present disclosure.
Figure 4B:
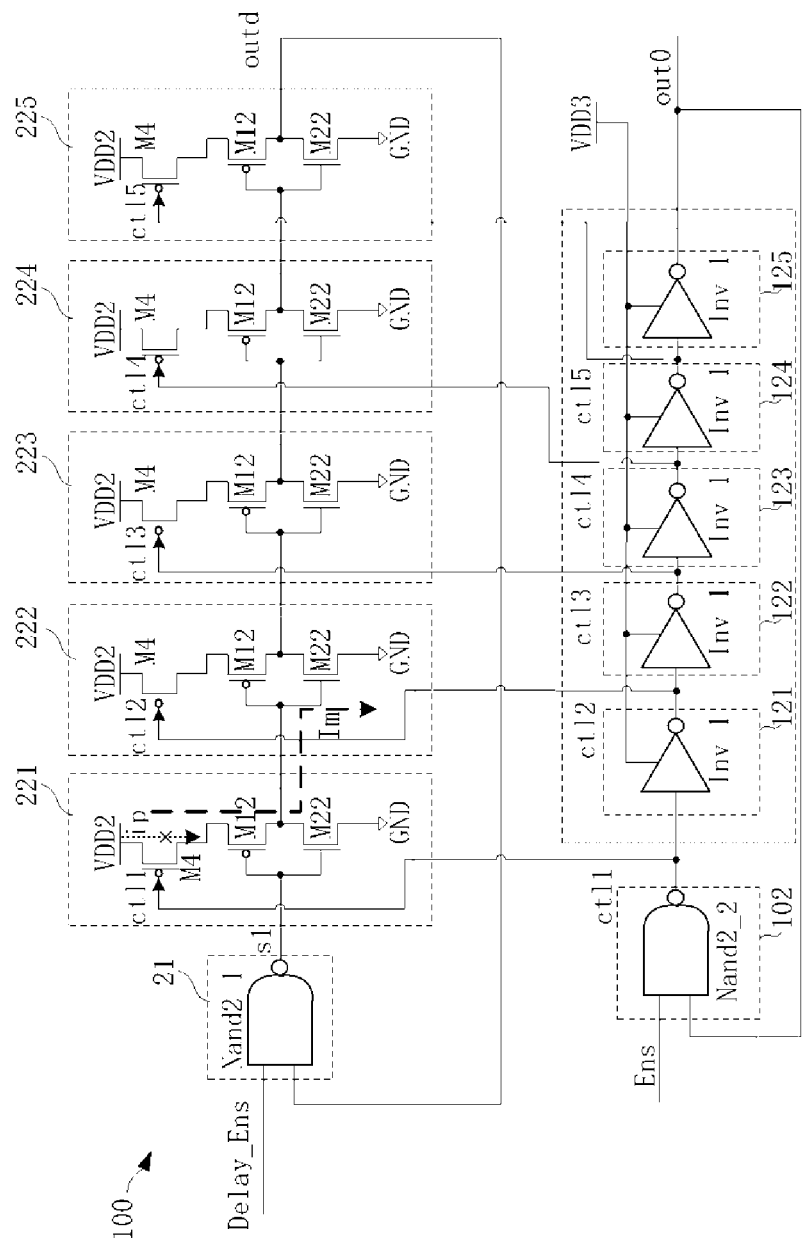
FIG. 4b is a schematic circuit diagram of a delay measurement circuit according to the second embodiment of the present disclosure.

As an example, please refer to FIG. 4a-FIG. 4b. The target link unit includes N-level series-connected target unit 221, target unit 222, target unit 223, target unit 224, and target unit 225. The input terminal of the first-stage target unit 221 is connected to the output terminal of the first logic control unit 21 to receive the first initial delay signal s1; the output terminal of the last stage target unit 225 is used as the output terminal of the target link unit 22 to output the target output signal outd; the target unit 22k is configured is: the control terminal is used to receive the corresponding control signal ctlk, the first terminal is connected to the first potential VDD1, and the second terminal is connected to the ground terminal GND; the first logic control unit 21 is configured as: the first input terminal is connected to the target oscillating module, the output terminal of 20 is to receive the target output signal outd, and the second input terminal receives the second enabling signal Delay_Ens, for generating the first initial delay signal s1 according to the second enabling signal Delay_Ens and the target output signal outd; the first initial delay signal in s1 is used to trigger the level inversion of the output signal of the first-level target unit 221, and the level inversion of the output signal of the first-level target unit 221 triggers the level inversion of the output signal of the second-level target unit 222 Action, the level inversion of the output signal of the target unit 222 of the second stage triggers the level inversion action of the output signal of the target unit 223 of the third stage, and the level inversion of the output signal of the target unit 223 of the third stage triggers the target of the fourth stage, the level inversion action of the output signal of unit 224, the level inversion of the output signal of the 4th target unit 224 triggers the target unit 225 of the 5th level to output the target output signal outd; it is assumed that after being disconnected from the ground terminal GND/power supply terminal VDD2 within the time T1, it is connected to the ground terminal GND/power supply terminal VDD2 within the second preset time T2, and the target unit 22k maintains a logic voltage within the second preset time T2, level, to reduce the leakage current generated by the adjacent previous target unit during the level inversion of the target unit 22k in response to the input signal within the first preset time T1, and before the target unit 22k returns to the state, the corresponding control signal has controlled the adjacent previous target unit to be connected to the ground terminal GND/power supply terminal VDD2 within the second preset time T2, which will not affect the dynamic current change of the target unit 22k during the recovery state; k∈[2,5], k is an integer to avoid mutual influence of operating currents between two adjacent levels of target units, thereby improving the accuracy of electrical parameters of each level of target units in the delay measurement circuit 100 and improving the performance and reliability of the ring oscillator.

As an example, please continue to refer to FIG. 4a-FIG. 4b. The number of control units in the control oscillation module can be determined according to the actual needs of specific application scenarios. Those skilled in the art can undoubtedly determine that it is made under the inventive concept of the present disclosure. The equivalent/equivalent modifications of all belong to the protection scope of the embodiments of the present disclosure.

Figure 3A:
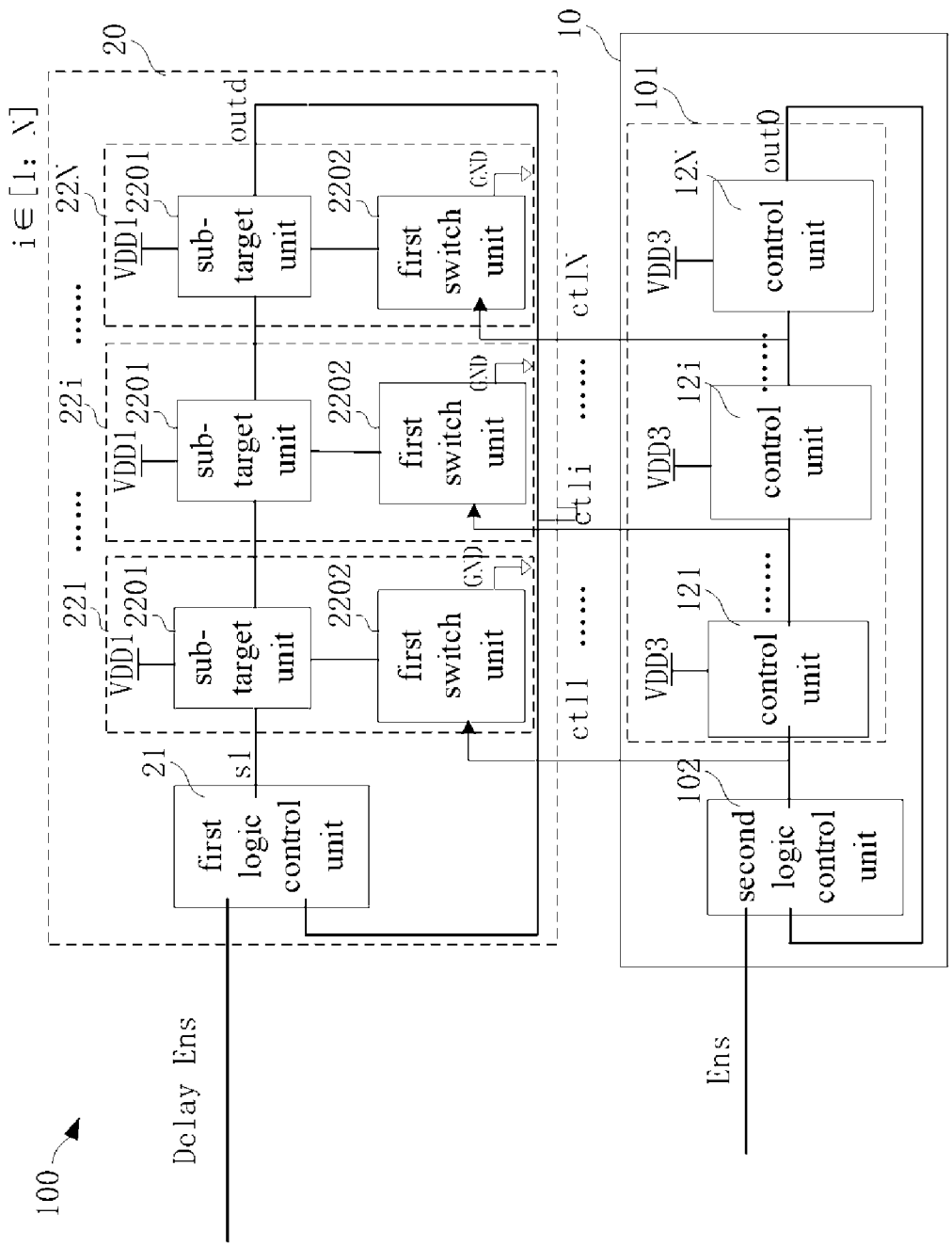
FIG. 3a is a schematic block diagram of a delay measurement circuit according to the fourth embodiment of the present disclosure.
Figure 5:
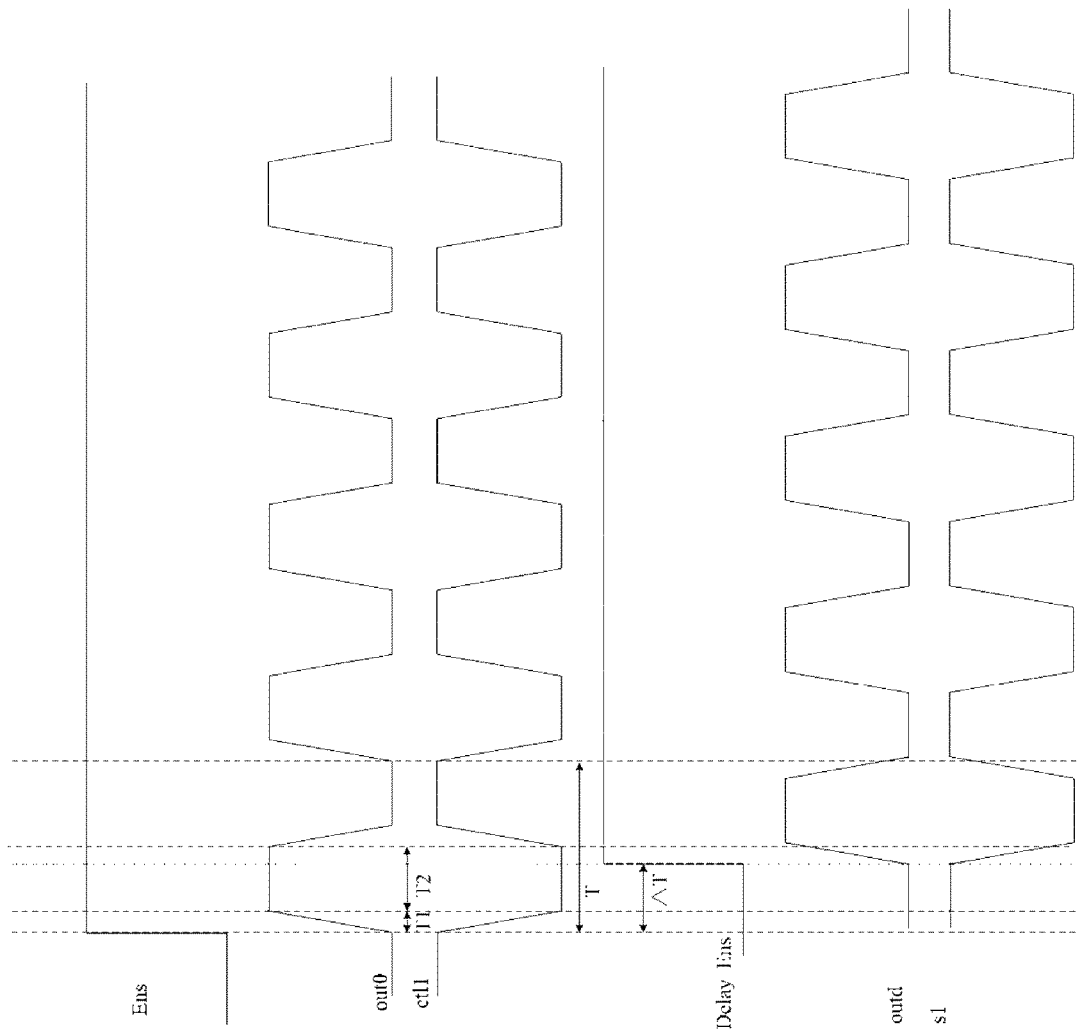
FIG. 5 is a schematic diagram of a working sequence of a delay measurement circuit according to an embodiment of the present disclosure.

As an example, please refer to FIG. 3a, FIG. 4a and FIG. 5, the sub-target unit 2201 includes a first transistor M11 and a second transistor M21, the first switch unit 2202 includes a third transistor M3, and the third transistor M3 is configured as: a first The terminal is connected to the sub-target unit 2201, the control terminal receives the corresponding control signal, and the second terminal is connected to the ground terminal GND; wherein, the third transistor M3 is used to respond to the corresponding control signal after it is disconnected within the first preset time T1, and then conduction within the second preset time T2. The first transistor M11 is configured as follows: the first end is connected to the first potential VDD1, the control end is connected to the output terminal of the adjacent previous target unit, and the second end is used as the output terminal of the current target unit; the second transistor M21 is configured as: the first terminal is connected to the second terminal of the first transistor M11, the control terminal is connected to the control terminal of the first transistor M11, and the second terminal is connected to the ground terminal GND via the third transistor M3. The first logic control unit 21 is configured as follows: the first input terminal is connected to the output terminal of the target oscillating module 20 to receive the target output signal outd, the second input terminal receives the second enabling signal Delay_Ens, and is used to receive the second enabling signal Delay_Ens according to the second enabling signal Delay_Ens. The target output signal outd generates a first initial delay signal s1; the level inversion in the first initial delay signal s1 is used to trigger the connection of the second transistor M21 in the first-level target unit 221 to the ground terminal GND via the third transistor M3. The target output signal outd and the first initial delay signal s1 are mutually inverse signals. Since the second transistor M21 in the first-level target unit 221 is grounded, the first-level target unit 221 provides a level inversion control signal to the second-level target unit 222, and the second-level target unit 222 responds to the level inversion control signal so that the second transistor M21 is disconnected from the ground terminal GND within the first preset time T1 via the third transistor M3. During the level inversion period, a current flow path shown by I0 is generated. The third transistor M3 in the first-level target unit 221 has been In response to the disconnection of the first control signal from the ground terminal GND, the current flow path indicated by i1 is cut off, therefore, the current during the conduction period of the second transistor M21 in the second-level target unit 222 is prevented from passing through the second transistor M21 in the first-level target unit 221. The three transistors M3 flow to the ground. Therefore, the leakage current during the level inversion of the output signal of the second-level target unit 222 is effectively reduced, and when the second transistor M21 is restored from the on state to the off state, the first control signal ctl1 has controlled the third transistor M3 in the target unit 221 to be connected to the ground terminal GND within the second preset time T2, which will not affect the dynamic current change of the target unit 221 during the recovery state; After the control signal is disconnected from the ground terminal GND within the first preset time T1, it is connected to the ground terminal GND within the second preset time T2, and the target unit maintains a logic level within the second preset time T2, In order to reduce the leakage current generated by the adjacent previous target unit during the operation of the target unit in response to the level inversion control signal, avoid the mutual influence of the operating current between the adjacent two target units, thereby improving the delay measurement circuit 100. The accuracy of the electrical parameters of the target unit is improved, and the performance and reliability of the ring oscillator are improved.

Figure 3B:
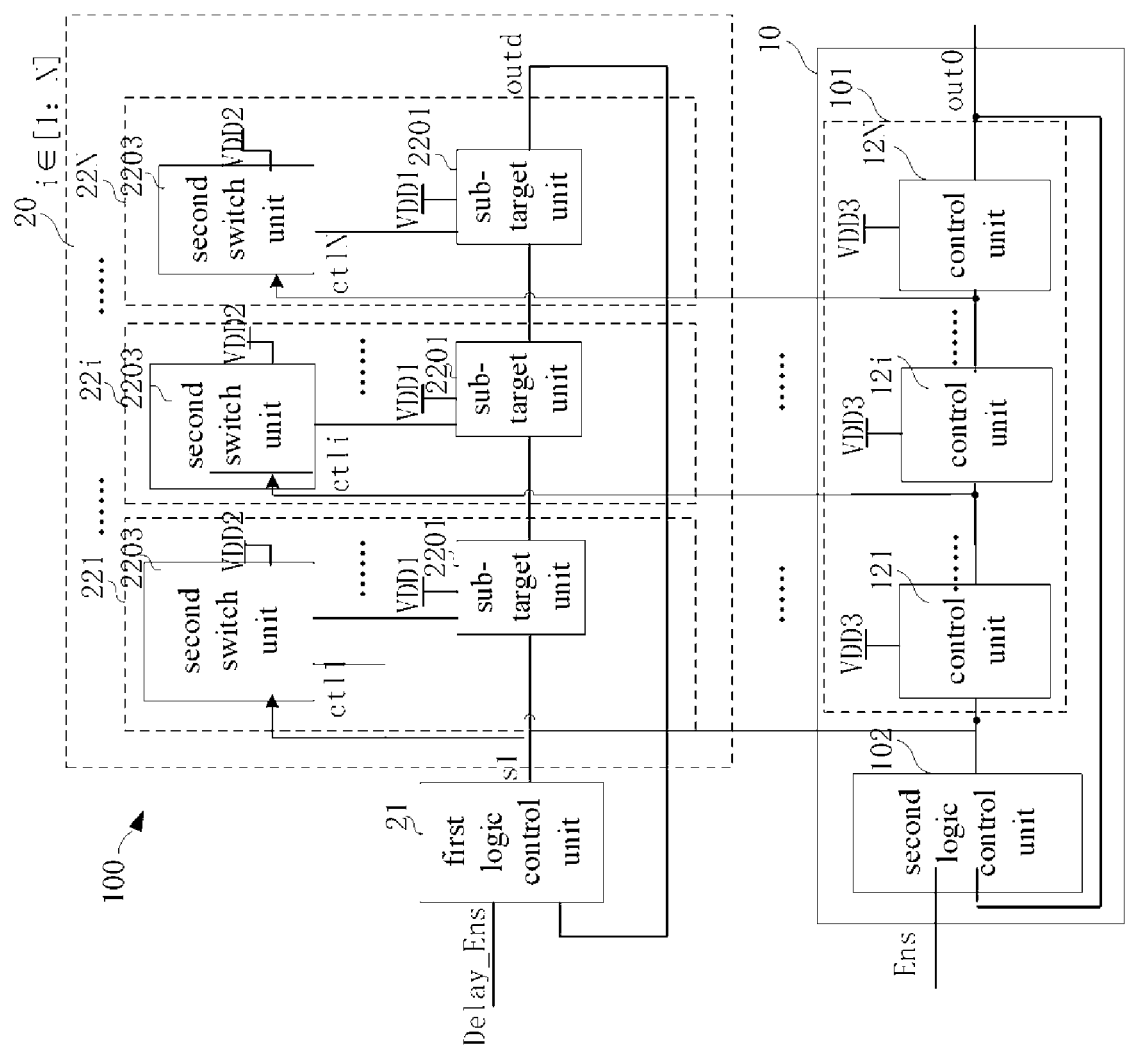
FIG. 3b is a schematic block diagram of a delay measurement circuit according to the fifth embodiment of the present disclosure.

As an example, please refer to FIG. 3b, FIG. 4b and FIG. 5, the sub-target unit 2201 includes a first transistor M12 and a second transistor M22, the second switch unit 2203 includes a fourth transistor M4, and the fourth transistor M4 is configured as: a first The terminal is connected to the power supply terminal VDD2, the control terminal receives the corresponding control signal, and the second terminal is connected to the first terminal of the first transistor M12; the fourth transistor M4 is used to respond to the corresponding control signal after it is disconnected within the first preset time T1, and then turn on within the second preset time T2. The first transistor M12 is configured as follows: the first terminal is connected to the second terminal of the fourth transistor M4, the control terminal is connected to the output terminal of the adjacent previous target unit, and the second terminal is used as the output terminal of the current target unit; the second transistor M22 It is configured as follows: the second terminal is connected to the second terminal of the first transistor M12, the second terminal is connected to the ground terminal GND, and the control terminal is connected to the control terminal of the first transistor M12. The first logic control unit 21 is configured as follows: the first input terminal is connected to the output terminal of the target oscillating module 20 to receive the target output signal outd, the second input terminal receives the second enabling signal Delay_Ens, and is used to receive the second enabling signal Delay_Ens according to the second enabling signal Delay_Ens, the target output signal outd generates the first initial delay signal s1; the level inversion in the first initial delay signal s1 is used to trigger the connection of the first transistor M12 in the first-level target unit 221 to the ground terminal GND via the second transistor M22, resulting in The first-level target unit 221 provides a level inversion control signal to the second-level target unit 222. During the level-inversion period of the second-level target unit 222, a current flow path shown in Im is generated, and the fourth transistor in the first-level target unit 221 M4 has been disconnected from the power supply terminal VDD2, cutting off the current flow path indicated by ip, therefore, avoiding the current shunting during the conduction period of the second transistor M22 in the second-level target unit 222 to the fourth transistor M4 in the first-level target unit 221, therefore, the leakage current during the level inversion of the output signal of the second-level target unit 222 is effectively reduced, and when the second transistor M22 is restored from the on state to the off state, the first control signal ctl1 has already controlled the target The fourth transistor M4 in the unit 221 is connected to the power supply terminal VDD2 within the second preset time T2, which will not affect the dynamic current change of the target unit 221 during the recovery state; After being disconnected from the power supply terminal VDD2 within a first preset time T1, it is connected to the power supply terminal VDD2 within a second preset time T2, and the target unit maintains a logic level within the second preset time T2 to reduce the target unit During the operation of the response level inversion control signal, the leakage current generated by the adjacent previous target unit avoids the mutual influence of the operating current between the adjacent two target units, thereby improving the electrical parameters of the target units at each level in the delay measurement circuit 100 accuracy, improving the performance and reliability of ring oscillators.

As an example, please continue to refer to FIG. 4a-FIG. 4b, the first transistor M11 and the first transistor M12 can beset as PMOS transistors, the second transistor M21 and the second transistor M22 can be set as NMOS transistors, the third transistor M3 can be set as NMOS transistors, and the fourth transistor M3 can be set as NMOS transistors. Transistor M4 is a PMOS transistor.

As an example, please continue to refer to FIG. 4a, FIG. 4b and FIG. 5, the first logic control unit 21 includes a first NAND gate Nand2_1, and the first NAND gate Nand2_1 is configured as: the first input terminal is connected to the output of the target oscillating module 20 terminal to receive the target output signal outd, and the second input terminal receives the second enabling signal Delay_Ens for generating the first initial delay signal s1 according to the second enabling signal Delay_Ens and the target output signal outd; wherein, the first NAND gate Nand2_1 When the second enable signal Delay_Ens is valid, the target output signal outd is received and the first initial delay signal s1 is output, and the level state of the first initial delay signal s1 is opposite to that of the target output signal outd. The level inversion in the first initial delay signal s1 is used to trigger the level inversion action of the output signal of the target unit 221 of the first stage, and the level inversion of the output signal of the target unit 221 of the first stage triggers the target unit 222 of the second stage. The level inversion action of the output signal of the target unit 222 of the second stage triggers the level inversion action of the output signal of the target unit 223 of the third stage. The level inversion of the output signal of the target unit 223 of the third stage triggers the level inversion action of the output signal of the target unit 224 of the 4th level, and the level inversion of the output signal of the target unit 224 of the 4th level triggers the target unit 225 of the 5th level to output the target output signal outd that each level of target unit receives. After the control signal is disconnected from the ground terminal GND/power supply terminal VDD2 within the first preset time T1, the target unit is connected to the ground terminal/power supply terminal within the second preset time T2. The logic level is maintained within the target unit to reduce the leakage current generated by the adjacent previous target unit during the level inversion of the target unit in response to the input signal within the first preset time T1, so as to avoid the gap between the adjacent two target units. The operating currents will affect each other, thereby improving the accuracy of the electrical parameters of the target units at all levels in the delay measurement circuit 100 and improving the performance and reliability of the ring oscillator.

As an example, please continue to refer to FIG. 4a, FIG. 4b and FIG. 5, the second logic control unit 102 includes a second NAND gate Nand2_2, and the second NAND gate Nand2_2 is configured as: the first input terminal is connected to the delay link unit 101, the output terminal is used to receive the initial output signal out0, and the second input terminal receives the first enable signal Ens, which is used to generate the first control signal ctl1 according to the first enable signal Ens and the initial output signal out0; wherein, the second NAND When the first enable signal Ens is active, the gate Nand2_2 receives the initial output signal out0 and outputs the first control signal ctl1, and the level state of the first control signal ctl1 is opposite to that of the initial output signal out0. The control link unit 101 comprises a control unit 121, a control unit 122, a control unit 123, a control unit 124 and a control unit 125 connected in series in 5 stages. The first terminals are all connected to the third potential VDD3, and the potential difference between the third potential VDD3 and the first potential VDD1 can be set to be greater than 0; each control unit includes a first inverter inv_1; the control link unit 101 includes 5 stages in series, the first inverter inv_1 of the first stage; the input terminal of the first inverter inv_1 is connected to the output terminal of the second NAND gate Nand2_2 to receive the first control signal ctl1, and the first control signal ctl1 is used to trigger the first stage of the first inverter inv_1 to generate the second control signal ctl2, the second control signal ctl2 is used to trigger the second stage of the first inverter inv_1 to generate the third control signal ctl3, the third control signal ctl3 is used to trigger the first inverter inv_1 of the third stage to generate the fourth control signal ctl4, and the fourth control signal ctd4 is used to trigger the first inverter inv_1 of the fourth stage to generate the fifth control signal ctl5; the fifth control signal ctl5 is used to trigger the first inverter inv_1 of the fifth stage to generate the initial output signal out0; so that the target unit of each stage is connected to the ground terminal GND/power supply terminal within the first preset time T1 according to the received control signal with a cycle time T after VDD2 is disconnected, it is connected to the ground terminal GND/power supply terminal VDD2 within the second preset time T2, and the target unit maintains a logic level within the second preset time T2, so as to reduce the response of the target unit to the input signal in the second preset time T2. During the level inversion period within a first preset time T1, through the leakage current generated by the adjacent target units of the previous stage, the mutual influence of the operating currents between the adjacent two-stage target cells is avoided, thereby improving the delay measurement circuit 100 at each stage. The accuracy of the electrical parameters of the target unit improves the performance and reliability of the ring oscillator.

Figure 6A:
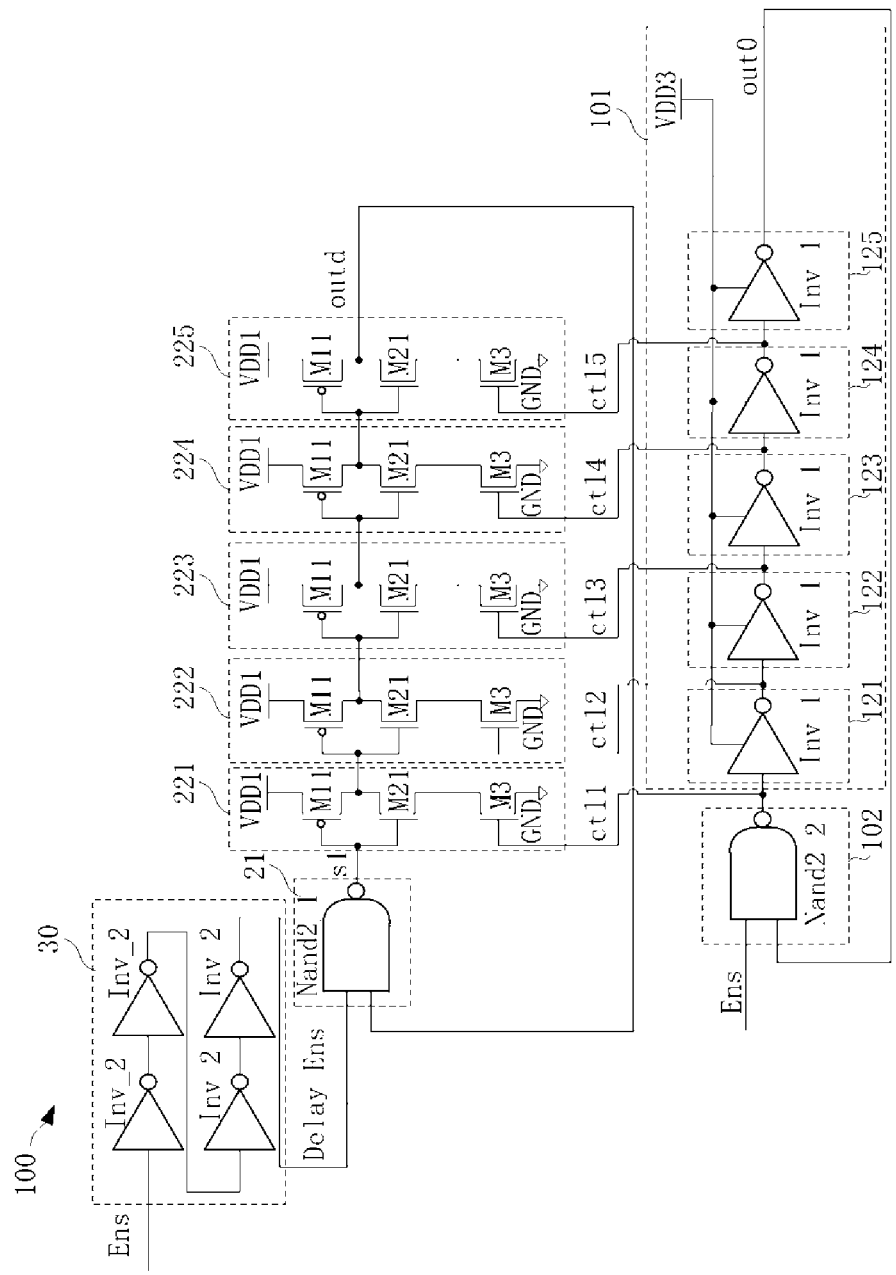
FIG. 6a is a schematic circuit diagram of a delay measurement circuit according to the third embodiment of the present disclosure.
Figure 6B:
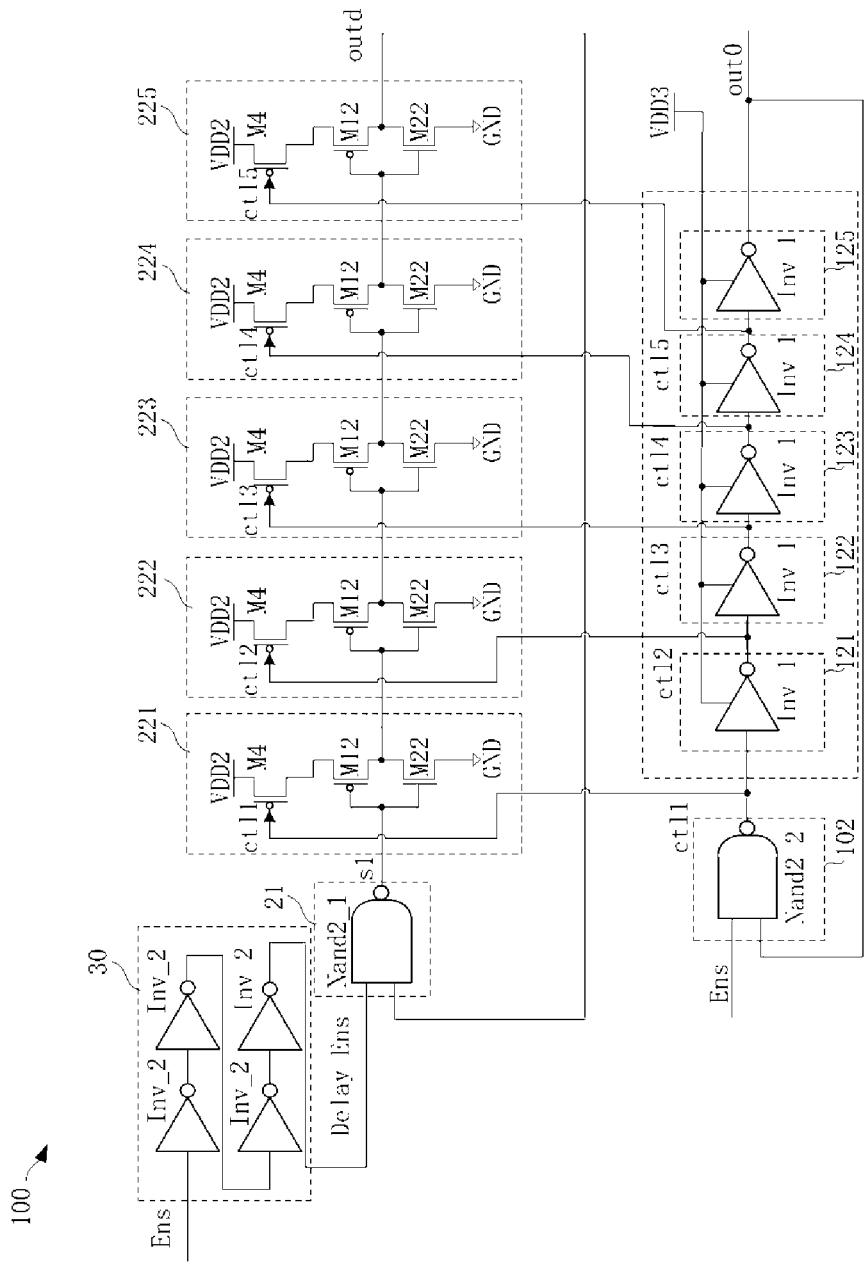
FIG. 6b is a schematic circuit diagram of a delay measurement circuit according to the fourth embodiment of the present disclosure.

As an example, please refer to FIG. 6a and FIG. 6b. The delay measurement circuit 100 further includes a delay module 30, and the delay module 30 is configured to: the input terminal receives the first enable signal Ens, the output terminal is connected to the input terminal of the target oscillating module 20, and it is used for generating the second enable signal Delay_Ens according to the first enable signal Ens, and providing it to the target oscillating module 20.

As an example, please continue to refer to FIG. 6a and FIG. 6b. The delay module 30 includes a 4-stage series-connected second inverter inv_2; the first enable signal Ens sequentially passes through the 4-stage series-connected second inverter inv_2 to oscillate to the target The module 20 provides a second enabling signal Delay_Ens, and the second enabling signal Delay_Ens is delayed by a first preset threshold ΔT than the first enabling signal Ens.

As an example, please continue to refer to FIG. 5, FIG. 6a and FIG. 6b, the first preset threshold ΔT is greater than or equal to T1+MT, and less than (M+0.5)T, M is a positive integer, so that after the target unit is disconnected from the ground terminal GND/power supply terminal VDD2 within the first preset time T1 according to the received control signal, each of the target oscillating modules is connected to the ground terminal GND/power supply terminal VDD2 within the second preset time T2, and the target unit keep the logic level within the second preset time T2 to reduce the leakage current during the level inversion of the target unit in response to the input signal within the first preset time T1, and avoid the action current on mutual influence between adjacent two levels of target units, thereby improving the accuracy of the electrical parameters of the target units at all levels in the delay measurement circuit, and improving the performance and reliability of the ring oscillator.

Figure 7A:
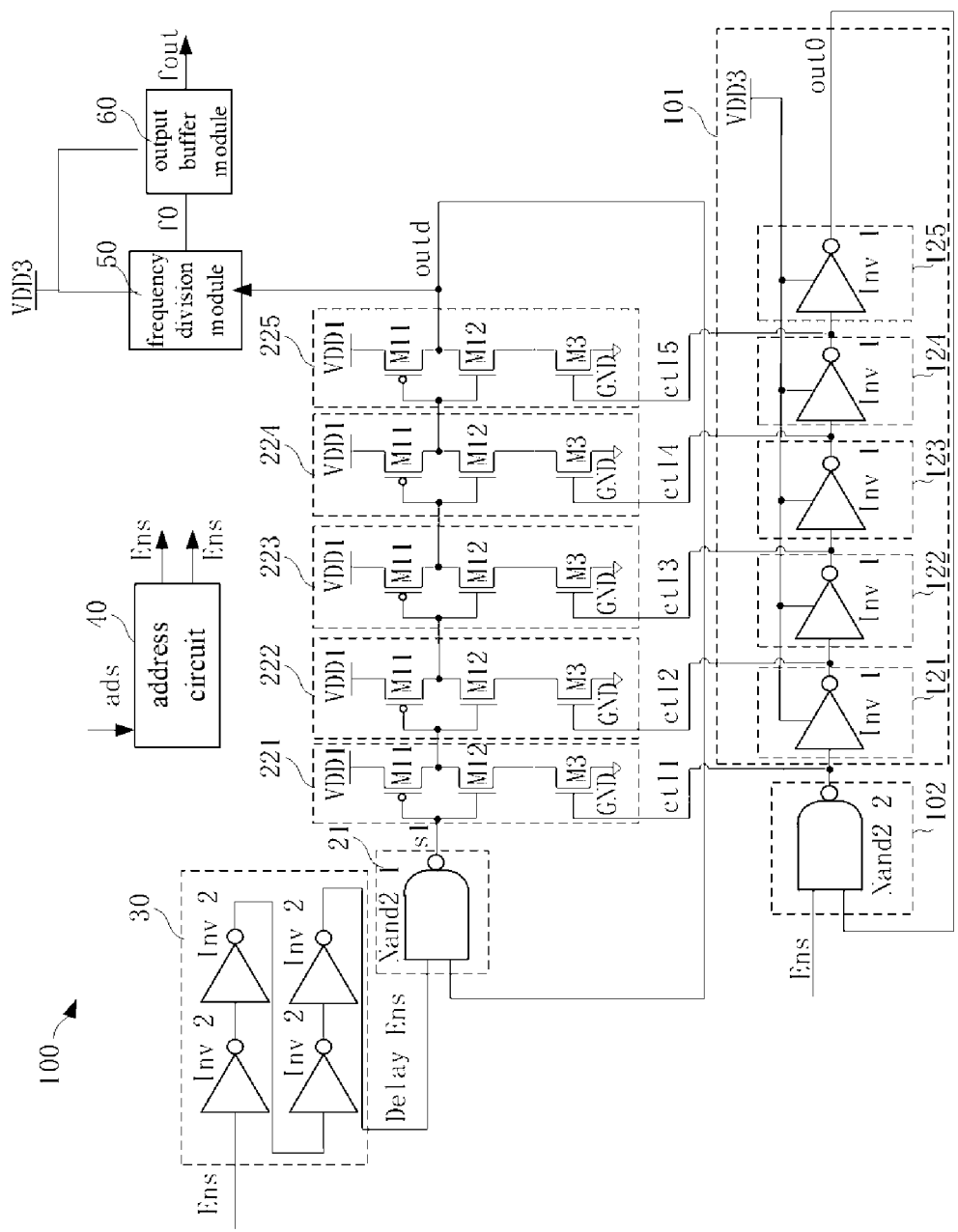
FIG. 7a is a schematic circuit diagram of a delay measurement circuit according to a fifth embodiment of the present disclosure.
Figure 7B:
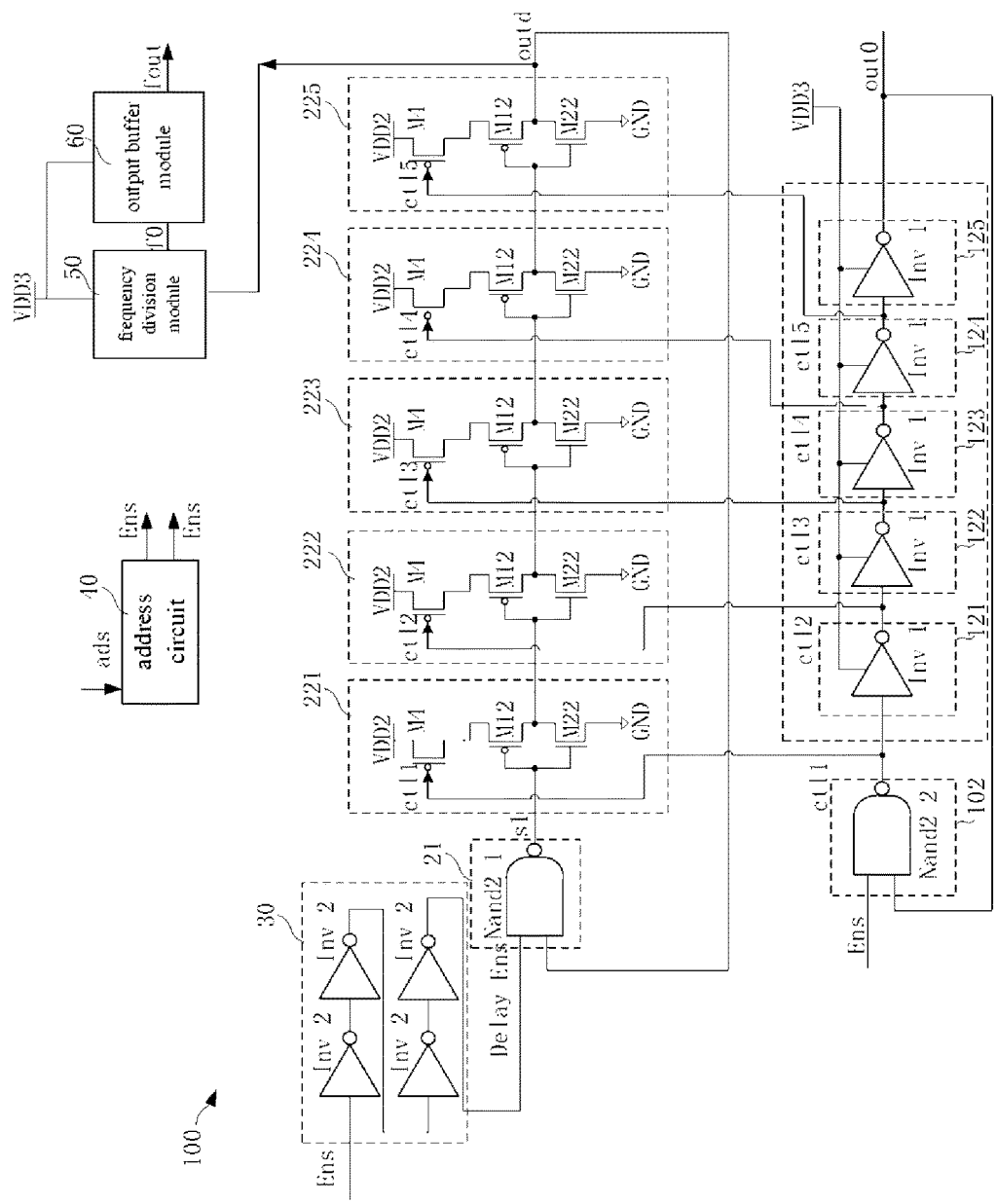
FIG. 7b is a schematic circuit diagram of a delay measurement circuit according to the sixth embodiment of the present disclosure.

As an example, please refer to FIG. 7a and FIG. 7b, the delay measurement circuit 100 further includes an address circuit 40, the address circuit 40 is used to receive the address signal ads, and generate a number of first enable signals Ens according to the address signal ads, which are provided to the corresponding control oscillation module and the delay module 30 are used to trigger the operation of the control oscillation module and the target oscillating module corresponding to the address.

As an example, please continue to refer to FIG. 7a and FIG. 7b, the delay measurement circuit 100 also includes a frequency division module 50, and the frequency division module 50 is connected to the output terminal of the target oscillating module for receiving the target output signal outd and converting the target output signal outd frequency division processing to generate the initial frequency division signal f) to meet the needs of different functional units in the integrated circuit for multiple different frequencies.

As an example, please continue to refer to FIG. 7a and FIG. 7b, the delay measurement circuit 100 also includes an output buffer module 60, the output buffer module 60 is connected to the output terminal of the frequency division module 50, and is used to receive the initial frequency division signal f0, and according to the initial frequency division signal f) generates a target frequency division signal fout. Since each stage of the target unit 22i in the target oscillating module 20 is disconnected from the ground terminal GND/power supply terminal VDD2 within the first preset time T1 according to the received control signal ctli with a cycle time of T, and then in the second preset time T2, it is connected with the ground terminal GND/power supply terminal VDD2, and the target unit maintains a logic level within the second preset time T2, so as to reduce the target unit 22i's response to the level inversion control signal during the action period through the adjacent previous target unit. The leakage current generated, i∈[1, N], i, N are both integers greater than or equal to 1, N is an odd number, T1+T2=T/2; avoid the interaction between the action currents between two adjacent target units influence, thereby improving the accuracy of the electrical parameters of the target units at all levels in the delay measurement circuit 100, and improving the performance and reliability of the ring oscillator.

As an example, please continue to refer to FIG. 7a and FIG. 7b. It is possible to set the power supply terminals of the frequency division module 50 and the output buffer module 60 to be connected to the third potential VDD3, so as to reduce the number of power supply ports in the delay measurement circuit 300 and improve the integration of the circuit. Degree, reduce the volume of the product and reduce the complexity of manufacturing.

As an example, please continue to refer to FIG. 7 a and FIG. 7 b, the output buffer module 60 may be configured to include one or more of a drive unit, a buffer, and a read-write conversion unit. The type and quantity of the electrical components contained in the output buffer module 60 can be determined according to the functional components in the actual circuit of the specific application scenario. Those skilled in the art can undoubtedly determine that equivalent/equivalent modifications made under the inventive concept of the present disclosure all belong to the protection scope of the embodiments of the present disclosure.

Figure 8:
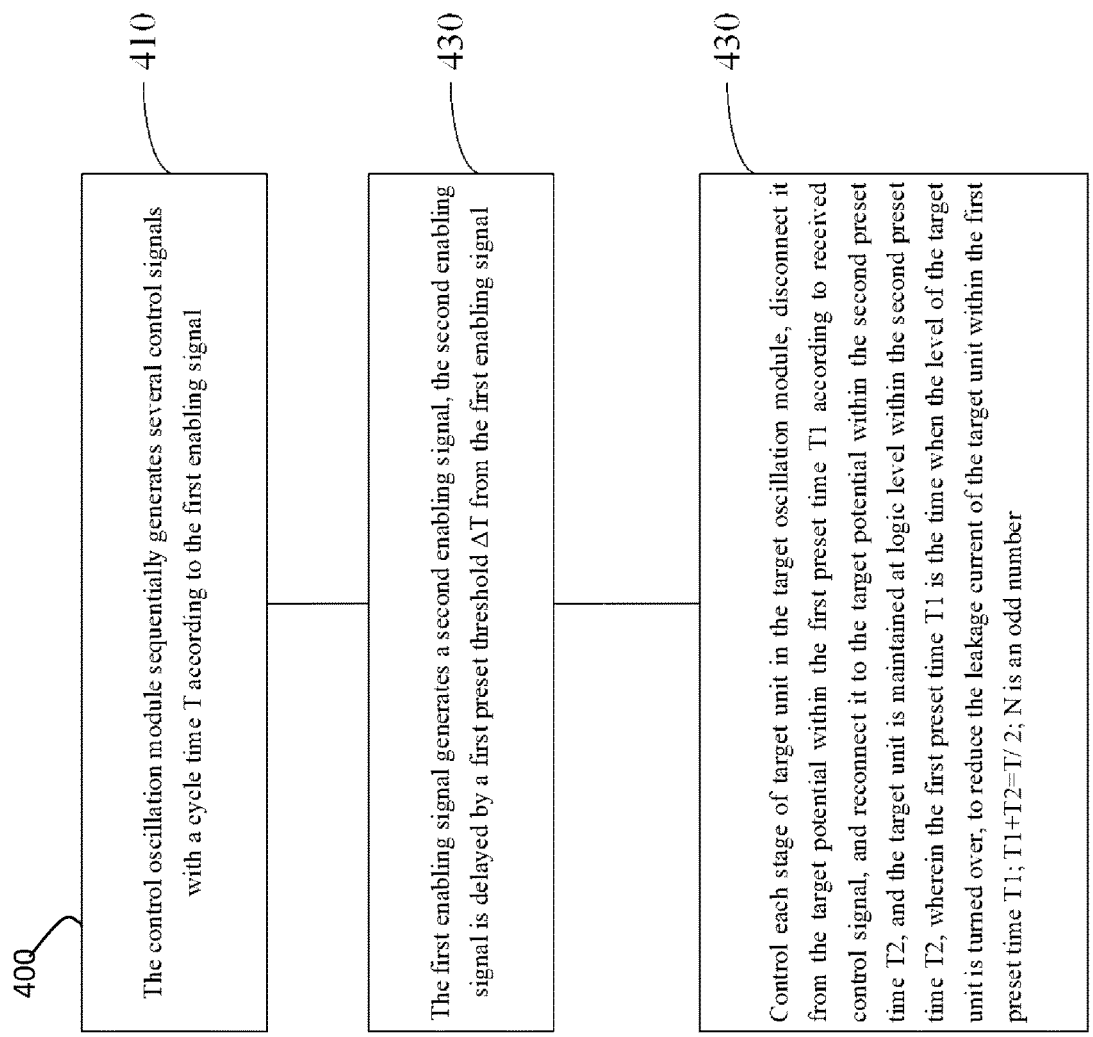
FIG. 8 is a schematic flowchart of a method for controlling a delay measurement circuit according to an embodiment of the present disclosure.

As an example, please refer to FIG. 8, in an embodiment of the present disclosure, a method 400 for controlling a delay measurement circuit is provided, including the following steps:

Step S410: Based on the response of the control oscillation module to the first enable signal, sequentially generate several control signals with a cycle time of T;

Step S420: Generate a second enabling signal according to the first enabling signal, and the second enabling signal is delayed by a first preset threshold ΔT than the first enabling signal;

Step S430: Control each level of the target unit in the target oscillating module to be disconnected from the target potential within the first preset time T1 according to the received control signal, and then connect to the target potential within the second preset time T2, and The target unit maintains a logic level within the second preset time T2, and the first preset time T1 is the time when the level of the target unit is reversed, so as to reduce the leakage current of the target unit within the first preset time T1; T1+T2=T/2; N is an odd integer.

Specifically, please continue to refer to FIG. 8 and FIG. 1. The target potential may include the ground terminal GND or the power supply terminal VDD2. By setting the control oscillation module 10, several control signals are sequentially generated according to the first enable signal Ens, such as control signals ctl1, ..., control signal ctli, ... and control signal ctlN, and set the target oscillating module 20 to include several levels of target units, such as target unit 221, ..., target unit 22i, ... and target unit 22N, each level of target unit 22i According to the received control signal ctli, after being disconnected from the ground terminal GND/power supply terminal VDD2 within the preset time, it is connected to the ground terminal GND/power supply terminal VDD2 within the second preset time T2, and the target unit is in the second preset time. The logic level is maintained within the time T2, so as to reduce the leakage current generated by the adjacent previous stage target unit during the level inversion period of the target unit $22i$ in response to the input signal within the first preset time T1, and the target unit $22i$ is During the recovery state, the corresponding control signal has controlled the adjacent previous stage target unit to communicate with the ground terminal GND/power supply terminal VDD2 within the second preset time T2, which will not affect the dynamic current change of the target unit $22i$ during the recovery state; $i \in [1, N]$, i and N are integers greater than or equal to 1, N is an odd number, T1+T2=T/2; avoid mutual influence of action currents between adjacent two-level target units, thereby improving the delay accuracy of the electrical parameters of target units at all levels as the circuit 100 is measured to improve the performance and reliability of the ring oscillator.

As an example, please continue to refer to FIG. 8 and FIG. 1. During the static period of the delay measurement circuit, the input current $i\_1$ of the drive power supply port in the target unit $22i$ can be measured, and the drive power supply in the target unit $22i$ can be measured during the oscillation period of the delay measurement circuit. The input current $i\_2$ of the port; the difference $i\_c$ between the current $i\_2$ and the current $i\_1$ is the effective drive current of the delay measurement circuit, and the drive voltage of the drive power port is set to $V\_d$, according to the effective drive current $i\_c$ and drive voltage $V\_d$, the equivalent resistance of the delay measurement circuit can be obtained, and then the equivalent capacitance of the delay measurement circuit can be obtained according to the quotient of the delay time of the delay measurement circuit and the equivalent resistance. Since each stage of the target unit $22i$ in the target oscillating module 20 is disconnected from the ground terminal GND/power supply terminal VDD2 within a preset time according to the received control signal ctli, and then is connected to the ground terminal GND/power supply terminal within a second preset time T2. The terminal VDD2 is connected, and the target unit maintains a logic level within the second preset time T2, so as to reduce the leakage current generated by the adjacent previous target unit during the operation of the target unit $22i$ in response to the level inversion control signal, $i \in [1, N]$, i, N are integers greater than or equal to 1, avoiding the mutual influence of the action currents between the adjacent two-stage target units, thereby improving the accuracy of the electrical parameters of the target units at all levels in the delay measurement circuit 100, Improve the performance and reliability of ring oscillators.

For the specific limitations of the control method of the delay measurement circuit in the above embodiment, please refer to the limitation of the delay measurement circuit above, which will not be repeated here.

It should be understood that although the various steps in the flow chart of FIG. 8 are displayed sequentially according to the arrows, these steps are not necessarily executed sequentially in the order indicated by the arrows. Unless otherwise specified herein, there is no strict order restriction on the execution of these steps, and these steps can be executed in other orders. Moreover, at least some of the steps in FIG. 8 may include multiple steps or stages. These steps or stages are not necessarily executed at the same time, but may be executed at different times. The execution order of these steps or stages is also It is not necessarily performed sequentially, but may be performed alternately or alternately with other steps or at least a part of steps or stages in other steps.

Those of ordinary skill in the art can understand that all or part of the processes in the methods of the above embodiments can be implemented through computer programs to instruct related hardware, and the computer programs can be stored in a non-volatile computer-readable memory In the medium, when the computer program is executed, it may include the processes of the embodiments of the above-mentioned methods. Wherein, any reference to memory, storage, database or other media used in various embodiments provided by the present disclosure may include non-volatile and/or volatile memory. Nonvolatile memory can include read only memory (ROM), programmable ROM (PROM), electrically programmable ROM (EPROM), electrically erasable programmable ROM (EEPROM), or flash memory. Volatile memory can include random access memory (RAM) or external cache memory. By way of illustration and not limitation, RAM is available in many forms such as Static RAM (SRAM), Dynamic RAM (DRAM), Synchronous DRAM (SDRAM), Double Data Rate SDRAM (DDRSDRAM), Enhanced SDRAM (ESDRAM), Synchronous Chain Synchlink DRAM (SLDRAM), memory bus (Rambus) direct RAM (RDRAM), direct memory bus dynamic RAM (DRDRAM), and memory bus dynamic RAM (RDRAM), etc.

Please note that the above-mentioned embodiments are for illustrative purposes only and are not meant to limit the present invention.

The technical features of the above-mentioned embodiments can be combined arbitrarily. For the sake of concise description, all possible combinations of the technical features of the above-mentioned embodiments are not described. However, as long as there is no contradiction in the combination of these technical features, they should be It is considered to be within the range described in this specification.

The above-mentioned embodiments only express several implementation modes of the present disclosure, and the description thereof is relatively specific and detailed, but should not be construed as limiting the scope of the patent application. It should be noted that those skilled in the art can make several modifications and improvements without departing from the concept of the present disclosure, and these all belong to the protection scope of the present disclosure. Therefore, the scope of protection of the disclosure should be based on the claims.

The invention claimed is:

1. A delay measurement circuit, comprising:
a control oscillation module, comprising an input terminal connected to an output terminal, wherein the input terminal receives a first enabling signal, and wherein the control oscillation module sequentially generates several control signals with a cycle time T according to the first enabling signal; and
a target oscillating module, comprising an input terminal connected to an output terminal, wherein the input terminal receives a second enabling signal, wherein the second enabling signal is delayed by a first preset threshold AT from the first enabling signal;
wherein, the target oscillating module includes N stages of the target unit connected in series, wherein each of the N stages of the target unit disconnects a target potential within a first preset time T1 according to one of the several control signals received, and then reconnects with the target potential within a second preset time T2, wherein the first preset time T1 is a time a level of said target unit turns over, wherein the second preset time T2 is the time when said target unit maintains a logic level, wherein a leakage current of said target unit is reduced within the first preset time T1; wherein T1+T2=T/2; and wherein N is an odd integer;

wherein the output terminal of the target oscillating module outputs a target output signal; wherein the target oscillating module further comprises:

a first logic control unit, comprising a first input terminal for receiving the target output signal, a second input terminal for receiving the second enabling signal, and an output terminal for outputting a first initial delay signal; and a target link unit, comprising a first input terminal receiving the first initial delay signal, a second input terminal receiving one of the control signals, and generating the target output signal according to said control signal and the first initial delay signal.

2. The delay measurement circuit according to claim 1, wherein the first logic control unit comprises:

a first NAND gate, configured to receive the target output signal and to output the first initial delay signal when the second enable signal is valid, wherein a level state of the first initial delay signal and a level state of the target output signal are inverted.

3. The delay measurement circuit according to claim 1, wherein the target link unit comprises N stages of the target unit connected in series, wherein N>2;

an input terminal of the target unit in a first stage is connected to the output terminal of the first logic control unit to receive the first initial delay signal; and an output terminal of the target unit at a last stage is an output terminal of the target link unit;

wherein the target unit at each stage further comprises: a control terminal receiving a corresponding control signal, a first terminal connected to a first potential, and a second terminal connected to the target potential.

4. The delay measurement circuit according to claim 3, wherein the target unit comprises a sub-target unit and a controllable switch unit;

wherein the sub-target unit comprises an input terminal connected to the output terminal of the target unit of an adjacent previous stage, a first terminal connected to the first potential, and a second terminal connected to the target potential via the controllable switch unit;

wherein when the control signal is within a first level range, the controllable switch unit is turned off within the first preset time T1; and wherein when the control signal is within a second level range, the controllable switch unit is turned on within the second preset time T2.

5. The delay measurement circuit according to claim 4, wherein the target potential comprises a ground level, and the controllable switch unit comprises a first switch unit;

wherein the first switch unit comprises a first terminal connected to the sub-target unit, a control terminal receiving a corresponding control signal, and a second terminal connected to the ground level; wherein the first potential is connected to the ground level, and wherein a potential difference between the first potential and the ground level is greater than zero.

6. The delay measurement circuit according to claim 4, wherein the target potential comprises a power supply and wherein the controllable switch unit comprises a second switch unit;

wherein the second switch unit comprises a first terminal connected to the power supply, a control terminal receiving a corresponding control signal, and a second terminal connected to the sub-target unit, wherein the power supply is connected to the first potential, wherein a potential difference between the power supply and the first potential is greater than zero.

7. The delay measurement circuit according to claim 5, wherein the sub-target unit comprises:

a first transistor, comprising a first terminal connected to the first potential, a control terminal connected to an output terminal of an adjacent previous target unit, and a second terminal used as an output terminal of a current target unit; and a second transistor, comprising a first terminal connected to the second terminal of the first transistor, a second terminal connected to the ground level via the first switch unit, and a control terminal connected to the control terminal of the first transistor.

8. The delay measurement circuit according to claim 7, wherein the first switch unit comprises:

a third transistor, comprising a first terminal connected to the second terminal of the second transistor, a control terminal receiving a corresponding control signal, a second terminal connected to the ground level;

wherein the third transistor is configured to be turned on within the second preset time T2 after being turned off within the first preset time T1 in response to the control signal.

9. The delay measurement circuit according to claim 6, wherein the sub-target unit comprises:

a first transistor, comprising a first terminal connected to the second terminal of the second switch unit, a control terminal connected to an output terminal of an adjacent previous target unit, wherein the second terminal is used as an output terminal of a current target unit; and a second transistor, comprising a first terminal connected to the second terminal of the first transistor, wherein the second terminal is connected to the ground level, and a control terminal connected to the control terminal of the first transistor.

10. The delay measurement circuit according to claim 9, wherein the second switch unit comprises:

a fourth transistor, comprising a first terminal connected to the power supply, a control terminal receiving a corresponding control signal, and a second terminal connected to the first terminal of the first transistor;

wherein the fourth transistor is configured to be turned on within the second preset time T2 after being turned off within the first preset time T1 in response to the control signal.

11. The delay measurement circuit according to claim 1, further comprising:

a delay module, wherein the delay module is coupled with the target oscillating module, comprising: an input terminal receiving the first enabling signal, an output terminal connected to the input terminal of the target oscillating module, wherein the delay module generates the second enabling signal from the first enabling signal, and provides the second enabling signal to the target oscillating module.

12. The delay measurement circuit according to claim 1, wherein an output terminal of the control oscillation module outputs an initial output signal, wherein the control oscillation module comprises:

a second logic control unit comprising an input terminal receiving the initial output signal, a second input terminal receiving the first enabling signal, and an output terminal outputting a first control signal; and a control link unit, comprising N stages series-connected control units, wherein the control link unit is configured to sequentially generate N−1 control signals and the initial output signal according to the received first control signal;

wherein one of the N stages series-connected control units in a first stage is connected to the output terminal of the second logic control unit, an output terminal of one of the N stages series-connected control units in a last stage is used as the output terminal of the control oscillation module, and wherein an input terminal of each of the N stages series-connected control units is connected to a corresponding control terminal of the target unit.

13. The delay measurement circuit according to claim 12, wherein the second logic control unit comprises:

a second NAND gate receiving the initial output signal and outputting the first control signal when the first enable signal is valid, wherein an electric level of the first control signal and an electric level of the initial output signal are inverted.

14. The delay measurement circuit according to claim 12, wherein the control unit comprises a first inverter;

wherein the first inverter comprises N stages connected in series, wherein the first inverter sequentially generates N−1 control signals and the initial output signal according to the received first control signal, and wherein each of the input terminal of the first inverter in one of the N stages is connected to the control terminal of the corresponding target unit.

15. The delay measurement circuit according to claim 1, wherein T1+MT≤ΔT<(M+0.5) T, wherein M is a positive integer.

16. The delay measurement circuit according to claim 1, further comprising:

an address circuit, configured to receive an address signal, to generate several first enabling signals according to the address signal and to provide the first enabling signals to the control oscillation module.

17. A delay measurement circuit, comprising:

a control oscillation module, comprising an input terminal connected to an output terminal, wherein the input terminal receives a first enabling signal, and wherein the control oscillation module sequentially generates several control signals with a cycle time T according to the first enabling signal;

a target oscillating module, comprising an input terminal connected to an output terminal, wherein the input terminal receives a second enabling signal, wherein the second enabling signal is delayed by a first preset threshold ΔT from the first enabling signal; and a delay module, wherein the delay module is coupled with the target oscillating module, comprising: an input terminal receiving the first enabling signal, an output terminal connected to the input terminal of the target oscillating module, wherein the delay module generates the second enabling signal from the first enabling signal, and provides the second enabling signal to the target oscillating module;

wherein, the target oscillating module includes N stages of the target unit connected in series, wherein each of the N stages of the target unit disconnects a target potential within a first preset time T1 according to one of the several control signals received, and then reconnects with the target potential within a second preset time T2, wherein the first preset time T1 is a time a level of said target unit turns over, wherein the second preset time T2 is the time when said target unit maintains a logic level, wherein a leakage current of said target unit is reduced within the first preset time T1; wherein T1+T2=T/2; and wherein N is an odd integer.

18. A delay measurement circuit, comprising:

a control oscillation module, comprising an input terminal connected to an output terminal, wherein the input terminal receives a first enabling signal, and wherein the control oscillation module sequentially generates several control signals with a cycle time T according to the first enabling signal;

a target oscillating module, comprising an input terminal connected to an output terminal, wherein the input terminal receives a second enabling signal, wherein the second enabling signal is delayed by a first preset threshold ΔT from the first enabling signal; and an address circuit, configured to receive an address signal, to generate several first enabling signals according to the address signal and to provide the first enabling signals to the control oscillation module;

wherein, the target oscillating module includes N stages of the target unit connected in series, wherein each of the N stages of the target unit disconnects a target potential within a first preset time T1 according to one of the several control signals received, and then reconnects with the target potential within a second preset time T2, wherein the first preset time T1 is a time a level of said target unit turns over, wherein the second preset time T2 is the time when said target unit maintains a logic level, wherein a leakage current of said target unit is reduced within the first preset time T1; wherein T1+T2=T/2; and wherein N is an odd integer.

* * * * *